United States Patent
Dutcher et al.

[11] Patent Number: 5,871,321
[45] Date of Patent: Feb. 16, 1999

[54] ENCAPSULATED FASTENER

[75] Inventors: Michael Dutcher, Fremont; Richard Blume, San Jose, both of Calif.; Hans Petrusk, Kirtland, Ohio

[73] Assignee: Applied Materials, Inc., Santa Clara, Calif.

[21] Appl. No.: 892,546

[22] Filed: Jul. 14, 1997

[51] Int. Cl.[6] .............................. F16B 19/00; F16B 33/00
[52] U.S. Cl. ..................... 411/368; 411/377; 411/903; 411/914
[58] Field of Search ...................... 411/155, 156, 411/368, 369, 378, 377, 908, 902, 903, 914

[56] References Cited

U.S. PATENT DOCUMENTS

| | | | |
|---|---|---|---|
| 2,824,663 | 2/1958 | Fischer | 411/903 X |
| 4,292,007 | 9/1981 | Wagner | 411/156 |
| 4,692,080 | 9/1987 | Hyner et al. | 411/903 X |
| 5,056,975 | 10/1991 | Ando | 411/155 |
| 5,122,021 | 6/1992 | Medal | 411/377 |

FOREIGN PATENT DOCUMENTS

| | | | |
|---|---|---|---|
| 358471 | 3/1990 | European Pat. Off. | 411/377 |
| 953009 | 3/1964 | United Kingdom | 411/377 |

*Primary Examiner*—Neil Wilson
*Attorney, Agent, or Firm*—Michael A. Glenn

[57] ABSTRACT

An improved, process compatible fastener is especially useful for securing a member, such as a wafer clamp ring, to an assembly for use in a process environment. The fastener is of a simple design, such that it is readily manufactured, and such that it is not a source of contamination. In particular, an integrated fastener includes both a metal fastener and a cone shaped metal lock washer within a single fastener assembly, such that a single fastener is used for accomplish the function of a screw and a washer. All surfaces of the fastener that are exposed within the process environment are encapsulated in a process compatible material. In this way, the fastener may be secured in the process environment in a single operation without leaving any gaps or partially exposed surfaces that may introduce contaminants into the process environment, such that the integrated fastener also provides the function of a process compatible cap.

23 Claims, 3 Drawing Sheets

ENCAPSULATED FASTENER

BACKGROUND OF THE INVENTION

1. Technical Field

The invention relates to semiconductor processing equipment. More particularly, the invention relates to an encapsulated screw, especially for use in a semiconductor wafer processing chamber in connection with a wafer clamp ring.

2. Description of the Prior Art

FIG. 1 is a cross sectional side elevation view of a wafer chuck 10 and clamping assembly 12. The chuck shown for purposes of example in the figure includes a flat upper surface 19 that is adapted to support a semiconductor wafer 16 during wafer processing. Such processing may involve such known techniques as ion implantation, CVD, PVD, or reactive ion etching. Although the examples provided herein are directed to processes involving annealing and reflow and not deposition, it will be appreciated by those skilled in the art that such wafer processing equipment may be used for many other processes.

The clamping assembly 12 secures the wafer 16 to the wafer chuck surface 19 during wafer processing. Typical wafer clamping assemblies are formed as ring-shaped members having an open inner portion 25 that allows access to the wafer surface during the various processing steps. The clamping assembly also includes a locating flange 27 that is configured to rest in a complementary slot 29, 31 during wafer clamping. A lift assembly, including a lift bracket 33 and lift finger(s) 17, is provided to raise and lower the wafer relative to the wafer chuck surface 19 and thereby allow the wafer 16 to be placed on and removed from the wafer chuck 10.

An important function of the wafer chuck is to provide thermal mass that precisely maintains the wafer at a desired temperature. Heating elements 11 are provided to raise the wafer temperature. For example, the heating elements may be provided as a dual-zone heater, i.e. a heater having two heating zones, or as a five-zone heater, i.e. a heater having five heating zones.

A thermal transfer gas may be supplied to a backside of the wafer through a gas conduit 15 to heat the wafer, and a cooling fluid, such as water, can be supplied to the wafer chuck through a fluid conduit 21. A thermocouple 13 that monitors the temperature of the wafer chuck surface 19 is used to control the temperature of the wafer by controlling the amount of heat and/or cooling supplied to the wafer by the heating elements 11, thermal transfer gas conduit 15, and/or cooling fluid conduit 21. The heating elements may be arranged in any of several known configurations.

In operation the clamping assembly 12 is first raised from the wafer chuck 10 by a lifter (not shown). The wafer 16 to be processed is then slid into position above the wafer chuck by a robot arm (not shown) and placed on several lift fingers 17. The lift fingers are retracted, thereby lowering the wafer onto the wafer chuck surface 19. The clamp ring is then lowered into position and wafer processing may begin.

The clamp ring must be mounted to the assembly. This is accomplished by the use of a screw or other such fastening mechanism, although a screw and lock washer is presently the most common method of accomplishing such mounting. In a typical application, up to twelve or more screws may be used to hold the clamp ring to the assembly.

While a screw is a simple and effective expedient for securing the clamp ring to the assembly, such screw is also a source of contamination within the processing environment. This is due, in part, to the fact that the screw is typically formed of a material that is not process compatible, i.e. a metal. To avoid poisoning the process, the screw is usually provided as part of a compound assembly that includes the screw, a lock washer, a flat washer, and a process compatible cap.

While variations on this arrangement may be found in the industry, it is almost always necessary to shield the screw from the process environment. In doing so, the screw mechanism becomes unnecessarily complex. Not only is the screw provided with a complement of washers, but the process compatible cap, while somewhat preventing exposure of the screw itself to the process environment, nonetheless becomes a significant source of contamination.

In particular, the cap must be seated on the head of the screw. Thus, the screw is first driven into the clamp ring to effect securement thereof, and the cap is then compression fitted to the screw. To do so, the four components of the compound screw assembly must be handled, and it is not unusual that one or more of the screw elements is dropped or lost during such procedure.

More significantly, because this arrangement does not provide an intimate airtight seal of the cap to the screw head, particulates can accumulate at the interface of the cap and the clamp ring. These particulates are a source of contamination. Further, the cap can become dislodged during processing, thereby exposing the screw to the process environment.

It would be advantageous to provide an improved, process compatible fastener that would allow a clamp ring to be secured to an assembly for use in a process environment. It would be further advantageous if such fastener were of a simple design, such that it is readily manufactured, and such that it is not a source of contamination.

SUMMARY OF THE INVENTION

The invention provides an improved, process compatible fastener that is especially useful for securing a member, such as a wafer clamp ring, to an assembly for use in a process environment. The fastener is of a simple design, such that it is readily manufactured and easily handled, and such that it is not a source of contamination.

In particular, the invention provides an integrated fastener that includes both a metal fastener and a cone shaped metal lock washer within a single fastener assembly. Thus, a single fastener is used for accomplish the function of a screw and a washer.

Significantly, all surfaces of the fastener that are exposed within the process environment are encapsulated in a process compatible material. In this way, the fastener may be secured in the process environment in a single operation without leaving any gaps or partially exposed surfaces that may introduce contaminants into the process environment. Accordingly, the fastener also includes the function of a process compatible cap.

DETAILED DESCRIPTION OF THE INVENTION

The invention provides an improved, process compatible fastener that is especially useful for securing a member, such as a wafer clamp ring, to an assembly for use in a process environment. The fastener is of a simple design, such that it is readily manufactured and easily handled, and such that it is not a source of contamination.

In particular, the invention provides an integrated fastener that includes both a metal fastener and a cone shaped metal lock washer within a single fastener assembly. Thus, a single fastener is used for accomplish the function of a screw and a washer.

Significantly, all surfaces of the fastener that are exposed within the process environment are encapsulated in a process compatible material. In this way, the fastener may be secured in the process environment in a single operation without leaving any gaps or partially exposed surfaces that may introduce contaminants into the process environment. Accordingly, the fastener also includes the function of a process compatible cap.

Figure 1:
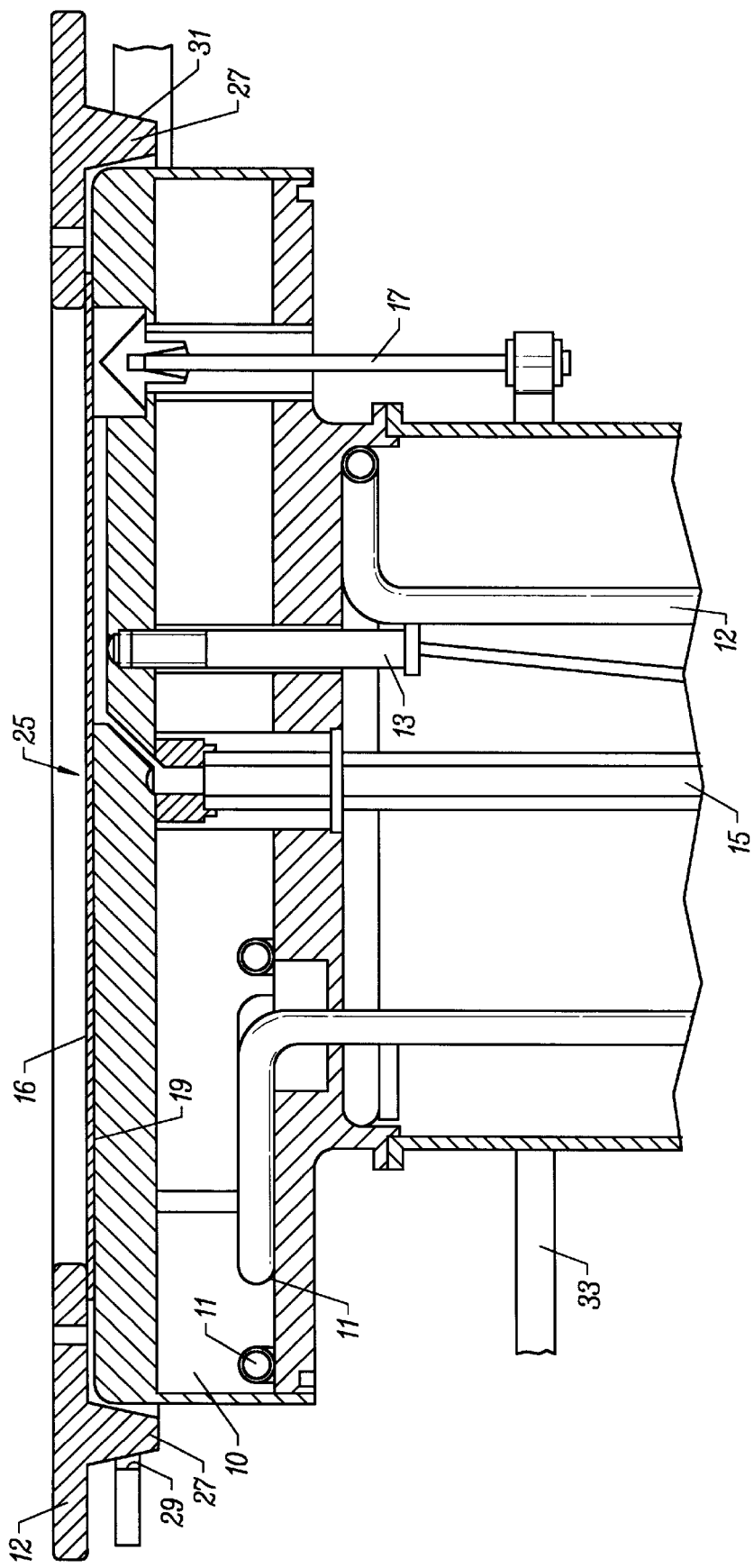
FIG. 1 is a schematic cross section of a wafer clamp ring and related components.
Figure 2:
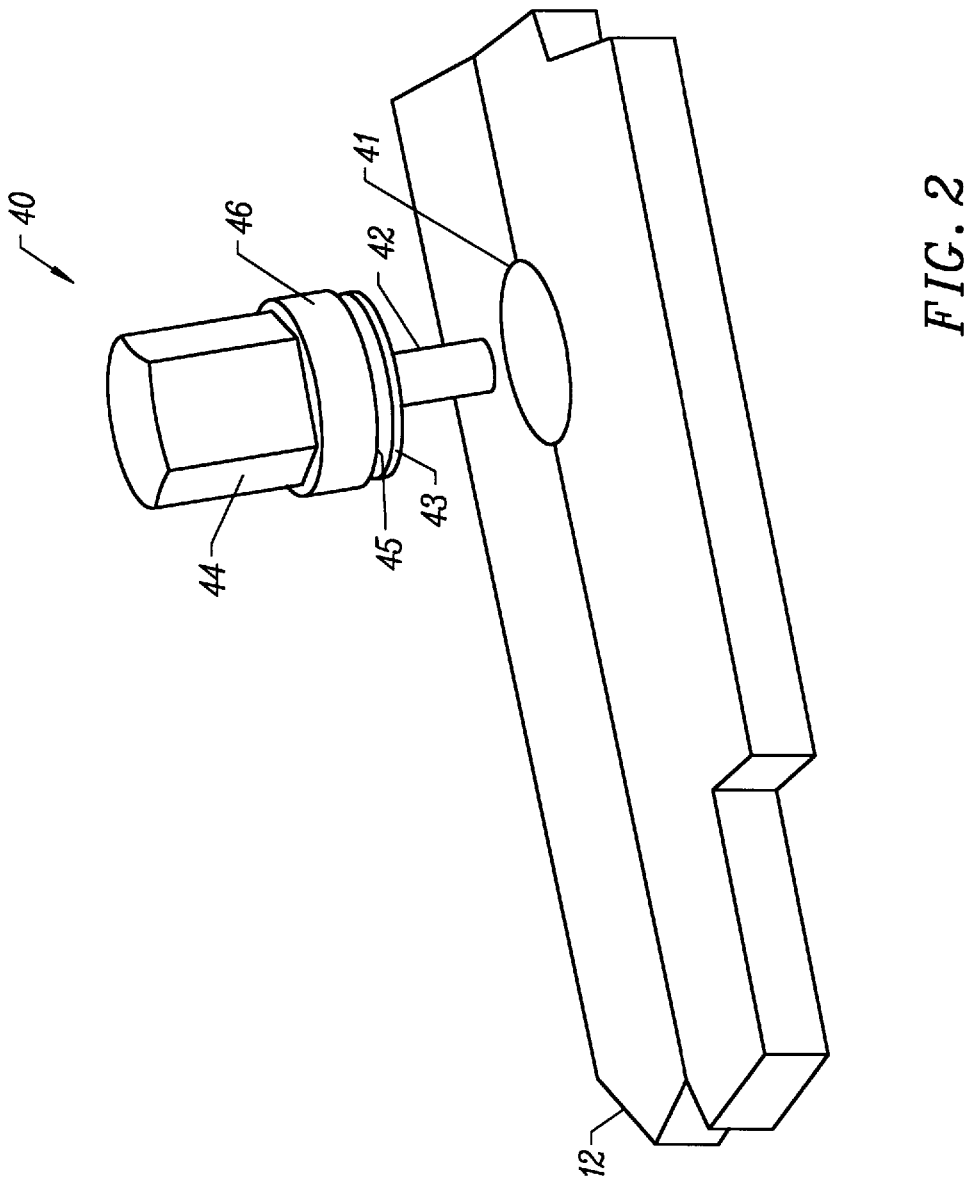
FIG. 2 is a perspective view of a portion of a clamp ring and an encapsulated fastener according to the invention.

FIG. 2 is a perspective view of a portion of a clamp ring and an encapsulated fastener according to the invention. In FIG. 2, the clamp ring 12 includes an aperture 41 that is adapted to receive an encapsulated fastener 40. The fastener is preferably made of metal, for example 304 stainless steel, but any material of sufficient strength and workability may be used. At least those portion of the fastener that are exposed to the process environment are encapsulated with a process compatible material. The material must produce a robust bond to the fastener such that it resists wear when the fastener is set and when in the process environment, ie. it must not flake or peel from the surface of the fastener either when the fastener is set with a tool or when the fastener is subjected to thermal cycling, i.e. during wafer processing within the process environment.

The preferred embodiment of the invention provides a process that injection molds a coating of a polysulfone material onto the exposed surface of the fastener, e.g. a material such as Ultem™-CRS 5001 low sodium grade encapsulating material manufactured by General Electric Corporation of Schenectady, N.Y. While the fastener is described herein in connection with an encapsulation process that involves injection molding, it will be appreciated by those skilled in the art that the invention is not so limited. Rather, fastener encapsulation may be achieved using any process compatible material that provides a robust bond to the fastener surfaces.

The fastener includes a head 44, which in the presently preferred embodiment of the invention is a hex head of a standard size (e.g. 0.375"), such that the fastener may be set using standard tools. It should be appreciated that the head may be of any configuration. However, it is presently preferred that the head be of a simple design having a minimum amount of surface area to reduce the possibility of contaminant build up.

The head extends to a concentric base 46 having a concave recess 45 formed in a bottom portion thereof. The base may also be any of configuration, although it is presently preferred that the recess be formed in the bottom portion of the base (as is discussed in greater detail below).

A shaft 42 extends from the base. The shaft may include a pattern of threads along all or a portion thereof, such that it mates with, and may be driven into, the aperture 41. In some applications of the invention, the aperture is not threaded and of sufficient diameter that the shaft may freely pass therethrough, such that the shaft extends beyond the clamp ring and can be freely rotated for engagement with an aperture formed in a portion of the assembly to which the clamp ring is attached (not shown). The presently preferred embodiment of the invention provides a shaft having a 4–40 thread. It will be appreciated that any thread pattern may be formed on the shaft.

A concave or cone-shaped lock washer 43 is positioned coaxially on the shaft. Such washer is also referred to as a Bellville washer and may be made of such materials as metal or plastic, e.g. ULTEM™. In the preferred embodiment of the invention, the washer has an outer diameter that is less than the outer diameter of the base 45 and that is configured such that it is surrounded by the base when the fastener is set. The concave shape of the washer is such that the washer exerts a bias against the base as the base is set to assure that the fastener is securely fixed in position. The concave bottom portion of the base encircles the washer, such that the fastener base intimately abuts an upper surface of the clamp ring when set, capturing the washer within the concavity formed in the base. In this way, no portion of the washer or shaft is exposed to the process environment.

Figure 3:
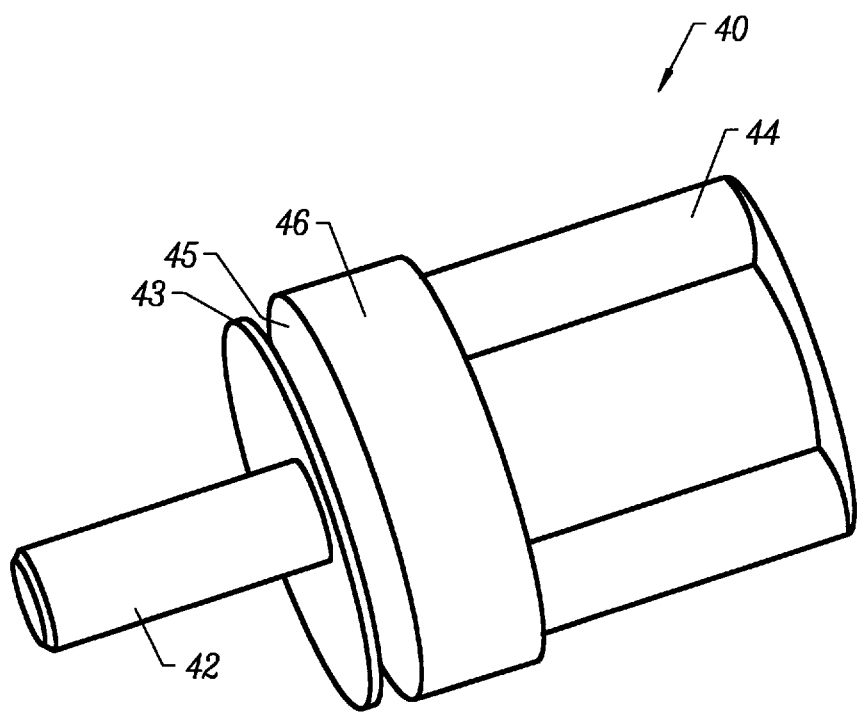
FIG. 3 is a perspective view of an encapsulated fastener according to the invention.

FIG. 3 is a perspective view of an encapsulated fastener according to the invention. As can be seen in FIG. 3, the cone shaped metal lock washer 43 is tightly fitted to the shaft of the fastener such that it remains with the fastener during shipping and handling, and yet can move relative to the base of the fastener head when the fastener is set to the clamp ring and related assembly.

Although the invention is described herein with reference to the preferred embodiment, one skilled in the art will readily appreciate that other applications may be substituted for those set forth herein without departing from the spirit and scope of the present-invention. Accordingly, the invention should only be limited by the Claims included below.

We claim:

1. A fastener for use in a process environment, comprising:
    a fastener member, comprising:
        a head portion that extends to a concentric base; and
        a shaft extending from said base; and
    a washer positioned coaxially on said shaft;
    wherein all surfaces of said fastener member and said washer that are exposed to said process environment are encapsulated in a process compatible material;
    wherein said fastener member base having a concave recess formed in a bottom portion thereof.

2. The fastener of claim 1, said washer comprising:
    a concave or cone-shaped washer.

3. The fastener of claim 2, said washer further comprising:
    a Beliville washer.

4. The fastener of claim 1, wherein said washer has an outer diameter that is less than the outer diameter of said base; and wherein said washer is configured such that it is surrounded by said base when said fastener is set;
    wherein said washer is adapted to be captured within a concavity formed in said base, such that no portion of said washer or shaft is exposed to said process environment when said fastener is set.

5. The fastener of claim 2, wherein said washer is adapted to exert a bias against said base as said base is set to assure that the fastener is securely fixed in position.

6. The fastener of claim 1, wherein said head portion is a hex head of a standard size.

7. The fastener of claim 1, wherein said fastener is made of a metal that may include 304 stainless steel.

8. The fastener of claim 1, said shaft further comprising a pattern of threads along all or a portion thereof.

9. The fastener of claim 1, wherein said process compatible material comprises:

an injection molded coating.

10. The fastener of claim 1, wherein said fastener member and said washer are integrated to provide a unitary structure.

11. The fastener of claim 1, wherein said process compatible material comprises:

a polysulfone material.

12. The fastener of claim 11, wherein said process compatible material comprises:

Ultem™-CRS 5001 low sodium grade encapsulating material.

13. A fastener for use in a process environment, comprising:

ahead portion that extends to a concentric base;

a shaft extending from said base and a washer positioned coaxially on said shaft;

wherein all surfaces of said fastener member that are exposed to said process environment are encapsulated in a process compatible material;

wherein said fastener member base having a concave recess formed in a bottom portion thereof.

14. The fastener of claim 13, said washer comprising:

a concave or cone-shaped washer.

15. The fastener of claim 14, said washer further comprising:

a Beliville washer.

16. The fastener of claim 13, wherein said washer has an outer diameter that is less than the outer diameter of said base; and wherein said washer is configured such that it is surrounded by said base when said fastener is set; wherein said washer is adapted to be captured within a concavity formed in said base, such that no portion of said washer or shaft is exposed to said process environment when said fastener is set.

17. The fastener of claim 13, wherein said washer is adapted to exert a bias against said base as said base is set to assure that the fastener is securely fixed in position.

18. The fastener of claim 13, wherein said head portion is a hex head of a standard size.

19. The fastener of claim 13, wherein said fastener is made of a metal that may include 304 stainless steel.

20. The fastener of claim 13, said shaft further comprising a pattern of threads along all or a portion thereof.

21. The fastener of claim 13, wherein said process compatible material comprises:

an injection molded coating.

22. The fastener of claim 13, wherein said process compatible material comprises:

a polysulfone material.

23. The fastener of claim 22, wherein said process compatible material comprises:

Ultem™-CRS 5001 low sodium grade encapsulating material.

* * * * *